United States Patent
Weis

(10) Patent No.: US 10,991,674 B2
(45) Date of Patent: Apr. 27, 2021

(54) ELECTRONIC ASSEMBLY AND ELECTRONIC SYSTEM WITH IMPEDANCE MATCHED INTERCONNECT STRUCTURES

(71) Applicant: AT&S Austria Technologie & Systemtechnik Aktiengesellschaft, Leoben (AT)

(72) Inventor: Gerald Weis, St. Marein im Mürztal (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/298,512

(22) Filed: Mar. 11, 2019

(65) Prior Publication Data
US 2019/0304952 A1    Oct. 3, 2019

(30) Foreign Application Priority Data
Mar. 29, 2018  (EP) .................................... 18165132

(51) Int. Cl.
*H01L 25/065* (2006.01)
*H01L 23/66* (2006.01)
(Continued)

(52) U.S. Cl.
CPC .......... *H01L 25/0657* (2013.01); *H01L 23/66* (2013.01); *H01L 24/02* (2013.01);
(Continued)

(58) Field of Classification Search
CPC ......... H05K 2201/10545; H05K 1/183; H05K 2201/10378; H05K 1/025; H01L 25/0657;
(Continued)

(56) References Cited

U.S. PATENT DOCUMENTS

2002/0185303 A1 * 12/2002 Takeuchi ............. H05K 1/0231
174/256
2006/0027935 A1    2/2006 Hedler et al.
(Continued)

FOREIGN PATENT DOCUMENTS

DE    10 2014 107 514 A1    3/2015
TW         200834844 A       8/2008
(Continued)

*Primary Examiner* — Thanh Y. Tran
(74) *Attorney, Agent, or Firm* — Robert A. Blaha; Smith Tempel Blaha LLC

(57) ABSTRACT

Provided is an electronic assembly including (a) an interconnect carrier having an electrically insulating core and at least two electrically conducting layers formed at the electrically insulating core; (b) a first integrated circuit chip mounted at a first side of the interconnect carrier; (c) a second integrated circuit chip mounted at a second side of the interconnect carrier opposite to the first side; and (d) an interconnection structure electrically connecting the first integrated circuit chip with the second integrated circuit chip. The electric interconnection structure extends around the insulating core and includes at least one electric conductor path which is designed in such a manner that an impedance match between the first integrated circuit chip and the second integrated circuit chip is provided. Further, there is provided an electronic system comprising such an electronic assembly.

15 Claims, 2 Drawing Sheets

(51) Int. Cl.
*H01L 23/00* (2006.01)
*H01P 3/06* (2006.01)
*H05K 1/18* (2006.01)
*H01L 23/538* (2006.01)
*H05K 1/02* (2006.01)

(52) U.S. Cl.
CPC ............... *H01L 24/16* (2013.01); *H01P 3/06* (2013.01); *H01L 23/5384* (2013.01); *H01L 2223/6622* (2013.01); *H01L 2223/6655* (2013.01); *H01L 2224/16157* (2013.01); *H01L 2224/16235* (2013.01); *H01L 2224/81203* (2013.01); *H01L 2225/06517* (2013.01); *H01L 2225/06548* (2013.01); *H01L 2225/06572* (2013.01); *H01L 2225/06575* (2013.01); *H01L 2225/06582* (2013.01); *H01L 2924/1531* (2013.01); *H01L 2924/18161* (2013.01); *H01L 2924/30111* (2013.01); *H05K 1/025* (2013.01); *H05K 1/183* (2013.01); *H05K 2201/10378* (2013.01); *H05K 2201/10545* (2013.01)

(58) Field of Classification Search
CPC ..... H01L 24/02; H01L 24/16; H01L 23/5384; H01L 2225/06575; H01L 2924/18161; H01L 2224/16235; H01L 2223/6655; H01L 2924/1531; H01L 2223/6622; H01L 2224/16157; H01L 2225/06517; H01L 2225/06548; H01L 2225/06572; H01L 2225/06582; H01L 23/49822; H01L 23/49827; H01P 3/06
See application file for complete search history.

(56) References Cited

U.S. PATENT DOCUMENTS

| | | |
|---|---|---|
| 2011/0031598 A1 | 2/2011 | Lee et al. |
| 2011/0075393 A1 | 3/2011 | Chandrasekaran et al. |
| 2012/0139105 A1 | 6/2012 | Lin et al. |
| 2014/0346668 A1 | 11/2014 | Mitsuhashi |
| 2015/0208510 A1* | 7/2015 | Pelley ............... H05K 1/181 361/743 |
| 2015/0216030 A1* | 7/2015 | Semmelmeyer .... H01L 25/0652 361/803 |
| 2015/0282298 A1 | 10/2015 | Atkinson et al. |
| 2018/0081069 A1* | 3/2018 | Oota ................... G01T 1/2935 |

FOREIGN PATENT DOCUMENTS

| | | |
|---|---|---|
| TW | 201021178 A | 6/2010 |
| WO | WO 2017/111957 A1 | 6/2017 |

* cited by examiner

ELECTRONIC ASSEMBLY AND ELECTRONIC SYSTEM WITH IMPEDANCE MATCHED INTERCONNECT STRUCTURES

CROSS-REFERENCE TO RELATED APPLICATION

This application claims the benefit of the filing date of European Patent Application No. 18 165 132.4 filed Mar. 29, 2018, which is incorporated herein by reference in its entirety.

TECHNICAL FIELD

The present invention generally relates to the technical field of electronic assemblies wherein at least two semiconductor chips are (a) interconnected with each other and (b) connected with other where the conductor structures are formed at or within a carrier. Specifically, the present invention relates to an electronic assembly with two integrated circuit chips being mounted face to face at two opposing sides of an interconnect carrier structure. Further, the present invention relates to an electronic system comprising such an electronic assembly.

TECHNOLOGICAL BACKGROUND

In the field of electronic manufacturing for many years there is a continuous demand to realize increasing product functionalities of electronic assemblies with reduced structural shape. This demand is met with a continuously increasing miniaturization of electronic assemblies. Thereby, not only the integration density of semiconductor chips and Integrated Circuit (IC) structures inside a chip package but also the integration density of other components such as component carriers and interconnect devices can be increased e.g. by means of (i) smaller conductor traces and/or (ii) multilayer structures allowing for a wiring circuitry within "three dimensions". Further, there are (miniaturization) approaches where electronic components are embedded within component carriers such as Printed Circuit Boards (PCBs).

Small IC structures inside a chip package need to be connected to other ICs and/or to the "outside world" such as conductor paths or contact pads formed on or at a component carrier. In particular, in High Frequency (HF) applications there are often required small interconnections with the same cross section from one end to another in order to avoid HF signal reflections due to impedance jumps. Such unwanted impedance jumps are observed for instance in many via connections wherein an electric contact between two chips is realized by a fully or partially metallized via which has been formed within a multilayer component carrier in a direction perpendicular to the orientation of the planes of the layer structures of the multilayer component carrier.

SUMMARY

There may be a need for improving the electric characteristics within an electronic assembly comprising at least two semiconductor chips.

This need may be met by the subject matter according to the independent claims. Advantageous embodiments of the present invention are described by the dependent claims.

According to a first aspect of the invention there is provided an electronic assembly comprising (a) an interconnect carrier comprising an electrically insulating core and at least two electrically conducting layers formed at the electrically insulating core; (b) a first integrated circuit chip mounted at a first side of the interconnect carrier; (c) a second integrated circuit chip mounted at a second side of the interconnect carrier, wherein the second side is opposite to the first side; and (d) an interconnection structure electrically connecting the first integrated circuit chip with the second integrated circuit chip. In accordance with the invention, the electric interconnection structure extends around the insulating core and comprises at least one electric conductor path which is designed in such a manner that an impedance match between the first integrated circuit chip and the second integrated circuit chip is provided.

The described electronic assembly is based on the idea that an impedance matched interconnection between two integrated circuit chips being mounted at opposing surfaces of an interconnect carrier can be realized by forming an appropriately (spatially) designed electric conductor path extending between corresponding electric connections or terminals of the two integrated circuit chips. Thereby, appropriate spatial dimensions for the conductor path should be used to provide a desired impedance of the electric conductor path. Preferably, the impedance of the electric conductor paths is exactly the same as both an output impedance of the first integrated circuit chip and an input impedance of the second integrated circuit chip. However, if these impedances do not match, the impedance of the electric conductor path can be selected such that it is in between the two different impedances. Generally speaking, the impedance value of the electric conductor path should be selected in such a manner that there is an optimal impedance match which results in a high quality of signals traveling between the two integrated circuit chips. Specifically, in particular for High Frequency (HF) applications, an appropriate impedance match may result in a significant reduction of unwanted signal reflections at impedance discontinuities or impedance jumps.

It is mentioned that in case there is no (perfect) impedance match between the above described output impedance and input impedance the electric conductor paths can be designed in such a manner that it comprises or causes at least two smaller impedance discontinuities, which may lead to less signal reflections as compared to a smaller number of (larger) impedance discontinuities.

Descriptively speaking, the described electronic assembly may provide an "extreme" packaging solution for a "face-to-face" chip interconnection with impedance-controlled interface. At least some of the impedance matched electric conductor paths are formed at or on the surface of the interconnect carrier. Thereby, the electronic conductor paths may be formed at least partially from one or more of the described electrically conducting layers which itself are formed at the electrically insulating core of the interconnect carrier.

OVERVIEW OF EMBODIMENTS

In this document the term "interconnect carrier" may refer to any structure which can be used as a "mounting base" for the two integrated circuit chips and optionally for further electronic (semiconductor) components. The interconnect carrier may be realized for instance by means of a (silicon) substrate known to be used for semiconductor applications, a laminate structure such as a (multilayer) Printed Circuit Board (PCB), etc.

It is mentioned that the (at least) two electrically conducting layers are formed both at the first side and the second side of the interconnect carrier. This means that one of the two electrically conducting layers is formed at the first side and the other one of the two electrically conducting layers is formed on the opposing second side.

It is pointed out that it is not necessary that the mentioned first side and the mentioned second side refer to planar surfaces of the described electronic assembly. The surfaces being assigned to each side may optionally comprise at least one recess or cavity, within which the chip may be accommodated or embedded.

The insulating core of the interconnect carrier may be made from any appropriate dielectric material such as resin and/or glass fibers, so-called prepreg or FR4 material. Further, so called High Frequency (HF) materials as described below may be employed. The insulating core may be a single layer material or a multilayer structure. Also, a multilayer structure is possible with an alternating sequence of electrically insulating and electrically conducting layers. A laminate structure may comprise the electrically insulating core and optionally other insulating layers and the described at least two electrically conducting layers, which may be attached to each other in particular by applying mechanical pressure, if desired supported by thermal energy. In some applications, the described interconnect carrier may provide a plate-shaped component carrier being capable of providing a large mounting surface for further electronic components and being nevertheless very thin and compact. The further electronic components may be (a) at least one further integrated chip, (b) at least one active electronic component such as e.g. a transistor, and (c) at least one passive electronic component such as a resistor, a capacitor or an inductor.

According to a further embodiment of the invention, the electric conductor path is formed around at least one edge of the insulating core. This means that the electric conductor paths can be seen as an "edge plated signal transmission track" which allows for a small or negligible amount of unwanted signal reflections on the conductor path extending (not straight) between the two integrated circuit chips. Further, forming the electric conductor path around an edge of the insulating core or an edge of the entire interconnect carrier may provide the advantage that there is available a sufficient amount of space wherein the electric conductor paths can be spatially designed in such a manner that the desired impedance match will be realized.

According to a further embodiment of the invention, the electric conductor path comprises at least two conductor tracks. This may provide the advantage that (HF) signals can be transmitted between the two integrated circuit chips with a high signal quality. Thereby, one of the two conductor tracks may be used for carrying the signal and the other one of the two conductor tracks may be used for ground (GND). Depending on the spatial relationship between the two conductor tracks the conductor track being used for GND may serve as the shielding structure such that a high electromagnetic compatibility (EMC) of the described electronic assembly can be realized. This holds both for electromagnetic radiation being emitted by the electronic assembly and for electromagnetic radiation being unintentionally captured by the electric conductor paths from the "outside world". An emitted electromagnetic radiation may compromise other electronic devices. Captured electromagnetic radiation may compromise the operation of the described electronic assembly in particular when being used for HF applications and/or when capturing HF electromagnetic radiation.

According to a further embodiment of the invention, the at least two conductor tracks are realized by a layered structure wherein an insulating layer is formed between the two conductor tracks. Thereby, the layered structure may be a "sandwich structure" wherein the insulating layer is inserted or formed between the two conductor tracks. This may provide the advantage that the above-mentioned high signal quality as well as the enhanced electromagnetic compatibility can be realized in an easy manner.

It is mentioned that at least one of the two conductor tracks can be realized by means of the above described at least two electrically conducting layers formed at the insulating core, if these conducting layers are structured or respectively patterned in an appropriate manner.

According to a further embodiment of the invention, the electronic assembly further comprises a further interconnection structure connecting the first integrated circuit chip with the second integrated circuit chip, wherein the further interconnection structure extends through the insulating core in an overlap region between the first integrated circuit chip and the second integrated circuit chip and comprises at least one further electric conductor path. This may provide the advantage that (in addition to the interconnection structure formed around the edge of at least the electrically insulating core) there is established a further very short electric connection between the two integrated circuit chips. Such a short inter chip connection may be used for instance for power signals which, due to the short length of the further interconnection structure, are subject to respectively undergo only a small damping. Further, in particular, for HF applications, short further electric conductor paths are of advantage also in the context of EMC.

According to a further embodiment of the invention, the at least one further electric conductor path is designed in such a manner that a further impedance match between the first integrated circuit chip and the second integrated circuit chip is provided.

Also, the further impedance match may be realized by choosing an appropriate spatial design and/or appropriate spatial dimensions of the at least one further electric conductor path. Thereby, an appropriate impedance of the further electric conductor path can be selected by choosing an appropriate cross-sectional area. This means that in addition to an advantageous power transmission capability also an at least approximate impedance match may be realized, which is of advantage in particular for HD application.

It is mentioned that the above described aspects of a multi-step impedance discontinuity of the interconnection structure and at the at least one electric conductor path also apply for the further interconnection structure and respectively the further electric conductor path.

According to a further embodiment of the invention, the further interconnection structure comprises at least one metallized via connection. Such a via connection through the electrically insulating core may be denominated as a direct vertical via connection. Relying on well-known via formation and via metallization techniques may provide the advantage that the further interconnection structure can be realized in an easy and reliable manner.

Depending on the specific application, the formation of the via(s) can be accomplished by mechanical drilling and/or laser drilling. Further, the metallization of the via(s) can be realized by a side wall metallization or a complete (via filling) metallization. In this respect it is obvious that a complete metallization yields a larger cross section of the respective further electric conductor path as compared to a via sidewall metallization only. The same holds also for side wall metallizations with different thicknesses. As a consequence, by varying the amount of metal which is used for a via connection an appropriate impedance value can be selected. Of course, also the diameter of the via is an important parameter for the desired impedance value of the further electric conductor path.

Preferably, the metallization of the at least one via is realized with copper, which is a comparatively cheap material having a very high electric conductivity, which is of advantage in particular for high power applications. However, depending on the specific application also other appropriate (conductive) metals can be used.

In some embodiments, the metallized via connection comprises, along its extension through the interconnect carrier, a constant cross section. In other embodiments, the metallized via connection comprises, along its extension through the interconnect carrier, a varying cross section.

As has already been mentioned above, the cross section of the further electric conductor path has an important influence on its impedance value. With a constant cross section, which may be achieved in particular when mechanical via drilling is used, a constant impedance value along the entire extension of the further electric conductor path is realized. By contrast thereto, a varying cross section yields a varying impedance along the further electric conductor path which may be used for realizing a continuously changing impedance in particular from a first impedance value being assigned to (an output of) the first integrated circuit chip to the second impedance value being assigned to (an input of) the second integrated circuit chip.

According to a further embodiment of the invention, the metallized via connection has the shape of a double truncated cone, wherein a tip portion of a first truncated cone being assigned to the first side of the interconnect carrier is connected to a tip portion of a second truncated cone being assigned to the second side of the interconnect carrier. In this respect the term "tip portion" may particularly refer to the end of the truncated cone which has the smallest (circular) cross section.

The described double truncated cone design may provide the advantage that appropriate power transfer capabilities can be obtained for the further electric conductor path. Thereby, apart from selecting either a full metallization or only a side wall metallization also the diameter, the opening or apex angle and/or the height of the respective truncated cone can be chosen in order to end up with an appropriate power transfer capability impedance value (distribution).

A double truncated cone shape may be realized in particular by laser drilling, wherein the first truncated cone is formed by a first laser beam impinging onto the first side of the interconnect carrier and the second truncated cone is formed by a second laser beam impinging onto the second side of the interconnect carrier.

According to a further embodiment of the invention, the further electric conductor path comprises at least two further conductor tracks realized in a coaxial configuration. Thereby, a first one of the two further conductor tracks may be an inner conductor and the other one of the two further conductor tracks may be an outer conductor, which surrounds the inner conductor (track) in a coaxial or concentric manner. In between the inner conductor and the outer conductor there may be provided an electrically insulating or dielectric material. Thereby, in a known manner the diameter of the first inner (further) conductor (track), the diameter of the second outer (further) conductor (track) and the dielectric constant of the material being provided between the two further conductor tracks are the relevant parameters for the impedance of the further electric conductor path being realized in a coaxial configuration.

A coaxial configuration of the further electric conductor path may be realized by (mechanical and/or laser) drilling. Thereby, first a large via with a large diameter may be formed within the interconnect carrier. Second, the large via is metallized preferably not completely but only at its side wall by a known metallization procedure. Third, a dielectric material is filled into the large via. Fourth, a small via with a small diameter is drilled concentrically within the large via by penetrating the (filled) dielectric material. Fifth, the small via is metallized either completely or only at its side walls again by means of a known metallization procedure.

The coaxial configuration of further conductor tracks may extend through the interconnect carrier along at least approximately a straight line between the first integrated circuit chip and the second integrated circuit chip. However, depending on the spatial constraints the further interconnection structure may also comprise a spatial course with at least one corner (and at least two straight lines).

Further, it is mentioned that the further interconnection structure may comprise at least one further conductor path, which directly connects the two integrated circuit chips with each other. Alternatively, there may be provided at least one further conductor path, which indirectly connects the two integrated circuit chips via an electric or electronic component which has an influence on the effective impedance value of the respective further conductor path.

According to a further embodiment of the invention, the electronic assembly further comprises an electronic component which is embedded within the interconnect carrier and which is electrically connected to at least one of the first integrated circuit chip and the second integrated circuit chip.

The described electronic component may be either a passive or an active electronic component. Preferably, a passive electronic component is or comprises a resistor, a capacitor and/or an inductor. Further, the passive electronic component may also be a magnetic component such as a ferrite by which the impedance value or the impedance distribution of the respective further electric conductor path can be adjusted or changed in a desired manner. Further, a capacitor and a power supply for one or both of the first integrated circuit chip and for the second integrated circuit chip may be stabilized. For this purpose, the capacitor should be positioned next to or at least close to the respective integrated circuit chip.

According to a further embodiment of the invention, the electronic assembly comprises at least one of the following features:

(A) The insulating core and/or other insulating structures of the interconnect carrier comprise(s) at least one selected from the group consisting of silicon, glass, ceramic, and an organic dielectric, in particular a resin, further in particular reinforced or non-reinforced resin, for instance epoxy resin or Bismaleimide-Triazine resin, FR-4, FR-5, cyanate ester, polyphenylene derivate, prepreg material, polyimide, polyamide, liquid crystal polymer, epoxy-based Build-Up Film, polytetrafluoroethylene, and a metal oxide.

(B) The at least two electrically conducting layers and/or other conducting material of the electronic assembly, in particular the interconnection structure and/or the further interconnection structure, comprises at least one material selected from the group consisting of copper, aluminum, nickel, silver, gold, palladium, and tungsten, any of the mentioned materials being optionally coated with supraconductive material such as graphene.

(C) The electronic assembly comprises at least one component, in particular embedded in and/or on the surface mounted on the interconnected carrier, wherein the at least one component is selected in particular from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a crypto-graphic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip.

(D) The interconnect carrier is shaped as a plate.

(E) The interconnect carrier is configured as a printed circuit board or a substrate.

In this context the term "shaped as a plate" may mean that the interconnect carrier is realized in a flat or planar design. Thereby, of course the interconnect carrier has a certain thickness. Realizing the interconnect carrier in the shape of a plate may provide the advantage that a large basis for mounting (other) components thereon can be provided.

Further, the term "printed circuit board" (PCB) may particularly denote a component carrier, which may be plate-shaped, three-dimensionally curved for instance when manufactured using 3D printing, or which may have any other shape. The PCB may be realized by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a PCB, a PCB is usually configured for accommodating one or more components on one or both opposing surfaces. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as the first integrated circuit chip and/or the second integrated circuit chip to be mounted thereon. More specifically, a substrate can be understood as a carrier for electrical connections or electrical networks as well as a component carrier comparable to a printed circuit board (PCB), however with a considerably higher density of laterally and/or vertically arranged connections. Lateral connections are for example conductive paths, whereas vertical connections may be for example metallized drill holes. These lateral and/or vertical connections are arranged within the substrate and can be used to provide electrical and/or mechanical connections of housed components or unhoused components (such as bare dies), with a PCB or intermediate PCB. Thus, the term "substrate" may also include "IC substrates". A dielectric part of a substrate may be composed of resin with reinforcing spheres (such as glass spheres).

According to a further aspect of the invention there is provided an electronic system comprising (a) a component carrier; and (b) an electronic assembly as described above, wherein the first integrated circuit chip and/or the second integrated circuit chip are electrically connected with conductor paths and/or terminal pads of the component carrier.

The described electronic system is based on the idea that a highly integrated electronic device can be realized in a compact design by mounting and electrically connecting the above described electronic assembly to a component carrier. Thereby, the component carrier may be any structure which can be equipped with electronic components such that "with the help" of the conductor paths an electronic circuit with a desired electric or electronic functionality is build up. The component carrier may be a PCB as specified above.

The first integrated circuit chip and/or the second integrated circuit chip may be mounted directly to the component carrier. Such a configuration can be realized for instance by a "Direct Board Attach" concept.

According to a further embodiment of the invention, the component carrier comprises a cavity, into which the electronic assembly is accommodated partially. In particular, one of the first integrated circuit chip and the second integrated circuit chip is accommodated completely within the cavity and the interconnect carrier is mounted to a surface of the component carrier.

In this embodiment, the interconnect carrier may not only establish a mechanical connection with the component carrier. There may also be electric connections between (lateral regions of) the interconnect carrier and the component carrier at component carrier portions, which surround and/or are located close to the cavity.

The cavity described in this embodiment may be a so-called open cavity which has a thickness of less than 500 µm, preferably less than 250 µm and more preferably of less than 100 µm.

The open cavity may be formed within a layered PCB with an embedded release layer inlay being spatially restricted to the region wherein the cavity is to be formed. By cutting at least one top layer of the PCB within the region of the embedded release layer inlay a cutout of the at least one top layer is generated which, together with the release layer inlay can be removed to form a cavity. This procedure, with which very thin cavities can be formed, is referred to by the applicant as the so called 2.5D technology (see applicant's website: http://ats.net/products-technology/technology/2-5d-technology-platform/).

According to a further embodiment of the invention, the component carrier comprises a cavity, into which the electronic assembly is accommodated completely. Thereby, in particular the surface of at least one of the first integrated circuit chip and the second integrated circuit chip is aligned with a surface of the component carrier. This may provide the advantage that on the one hand the electronic system can be realized in a compact design wherein most components of the electronic assembly are mechanically protected by the component carrier from external influences which might otherwise cause damage to the electronic assembly. On the other hand, by aligning the surface of an integrated circuit chip with a corresponding surface of the component carrier the entire system is easily accessible such that in particular electric connections "to the outside world" can be provided easily.

The component carrier may be for instance a PCB. Alternatively, the component carrier may be a mold with appropriately sized or dimensioned openings for accommodating the electronic assembly.

According to a further embodiment of the invention, the electronic system further comprises a mold structure which is formed over at least a part of the electronic assembly and over at least a part of the component carrier. This may provide the advantage that a mechanical protection of the electronic assembly can be realized in an easy manner simply by taking benefit from well-known molding techniques, molding procedures, and mold materials. Preferably, the mold structure together with the component carrier completely encapsulates the electronic assembly. Thereby, one of the two integrated circuit chips is embedded within the cavity, whereas the interconnect carrier is placed, with its lateral portion, on or to the surface of the component carrier. As a consequence, the other one of the two integrated circuit chips is located outside of the component carrier. As a consequence, the mold structure protects some portions of the component carrier. However, probably most important is the protection capability of the mold structure for mechanically protecting the other one of the two integrated circuit chips.

It has to be noted that embodiments of the invention have been described with reference to different subject matters. However, a person skilled in the art will gather from the above and the following description that, unless otherwise notified, in addition to any combination of features belonging to one type of subject matter also any combination between features relating to different subject matters is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
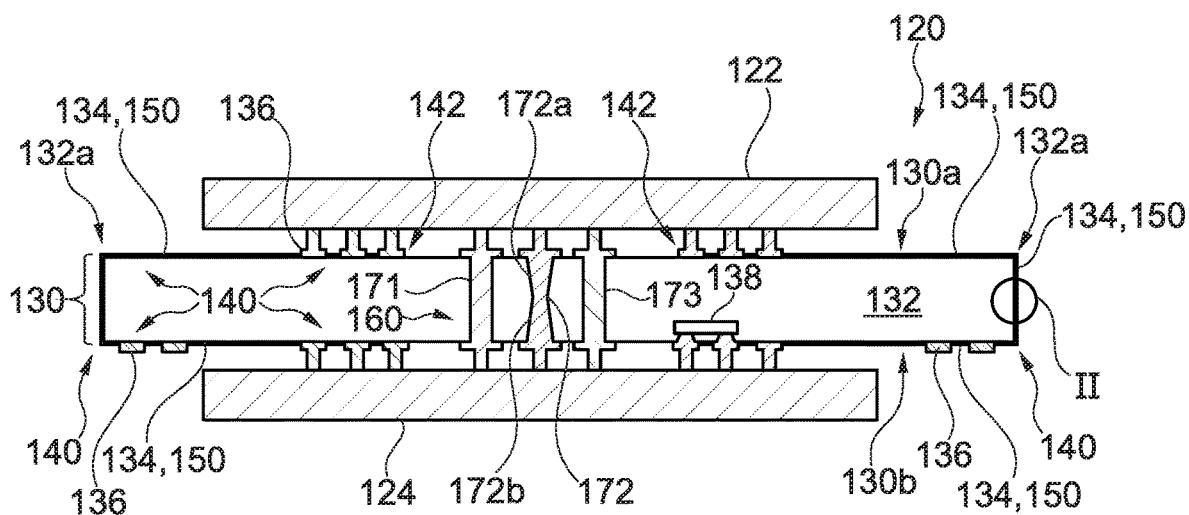
FIG. 1 shows an electronic assembly with two integrated circuit chips mounted face to face at respectively one side of an interconnect carrier and being electrically connected with each other by an impedance matched interconnection structure.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description. The invention will be described in more detail hereinafter with reference to examples of embodiment but to which the invention is not limited.

Further, spatially relative terms, such as "front" and "back", "above" and "below", "left" and "right", et cetera are used to describe an element's relationship to other element(s) as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an electronic assembly or electronic system according to an embodiment of the invention can assume orientations different than those illustrated in the Figures when in use.

FIG. 1 shows an electronic assembly 120 comprising an interconnect carrier 130 and two integrated circuit chips, a first integrated circuit chip 122 and a second integrated circuit chip 124. The first integrated circuit chip 122 is mounted to an upper surface or first side 130a of the interconnect carrier 130. The second integrated circuit chip 124 is mounted to the lower surface or second side 130b of the interconnect carrier 130.

The interconnect carrier 130 comprises an insulating core 132 and a conducting layer structure 134 formed thereon. Several contact pads 136 are formed at the second site 130b in order to contact the electronic assembly 120 with external parts such as e.g. a printed circuit board (PCB) or other (comparatively large) electronic or electric devices.

As can be taken from FIG. 1, the conducting layer structure 134 is also formed at the two edges 132a of the insulating core 132. Thereby, the conducting layer structure 134 is structured or patterned in such a manner that at least one electric conductor path 150 is formed. This at least one electric conductor path 150 forms a part of an electric interconnection structure 140, which electrically connects at least some contact terminals of the first integrated circuit chip 122 with at least some contact terminals of the second integrated circuit chip 124.

The electric interconnection structure 140 and the electric conductor path(s) 150 of the interconnection structure 140 are (spatially) designed in such a manner that there is provided an impedance match for signals travelling between the first integrated circuit chip 122 and the second integrated circuit chip 124.

Figure 2:
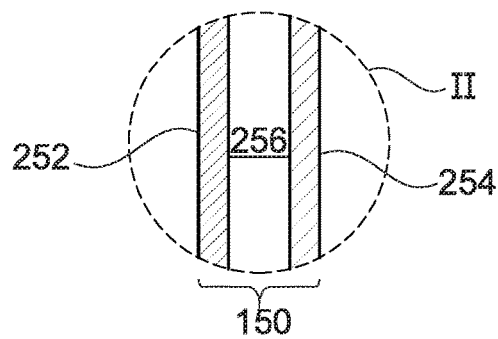
FIG. 2 shows an enlarged illustration of an electric conductor path with two conductor tracks separated by an insulating layer, wherein the electric conductor paths are formed at an edge of an insulating core of the interconnect carrier shown on FIG. 1.

In order to illustrate the spatial design of the signal path 150 according to the embodiment described here, there is shown (in FIG. 1) at the right side of the interconnect carrier 130 a circle which is denominated with the label "II". FIG. 2 shows this circle II in an enlarged view. As can be seen from this FIG. 2, the conductor path 150 comprises two conductor tracks 252 and 254, which are separated from each other by an insulating layer 256. By choosing appropriate thicknesses of e.g. the two conductor tracks 252, 254 and the insulating layer 256 a desired impedance value for the electric conductor path(s) 150 can be selected. Of course, in accordance with basic physical principles also the electric constant of the insulating layer 256 has an influence on the impedance.

Turning back to FIG. 1. According to the embodiment described here, the attachment of the first integrated circuit chip 122 as well as the attachment of the second integrated circuit chip 124 to the interconnect carrier 130 is realized by a plurality of thermal compression bonding elements 142. The technique of thermal compression bonding is well known to the skilled person and will not be elucidated in this document in further detail.

In the embodiment described here, there is provided a spacing between each one of the two integrated circuit chips 122, 124 and the respective surface of the interconnect carrier 130. It is mentioned that, e.g. by using other well-known techniques for attaching the integrated circuit chips 122, 124 to the interconnect carrier 130, compared to the dimensions depicted in FIG. 1, also a larger or a smaller spacing can be chosen. It might also be possible to directly attach at least one of the two integrated circuit chips 122, 124 to the interconnect carrier 130. In this case there would not be such spacing.

A further optional measure for realizing an appropriate impedance value of the interconnection structure 140 is an embedded passive component 138, which is connected with the interconnection structure 140 or which forms a part of the interconnection structure 140. According to the embodiment described here, this passive component is a capacitor 138. It is obvious that such a capacitor 138 (as well as e.g. an inductor) has an impact on the impedance value of the respective electric conductor path(s) 150 and also on the entire interconnection structure 140.

It is pointed out that the capacitor 138 may also be used for stabilizing a DC power supply for an integrated circuit chip. In the embodiment described here the capacitor 138 stabilizes the power supply for the second integrated circuit chip 124. Of course, also at least one further capacitor could be used for the same purpose for the first integrated circuit chip 122. In this respect it is mentioned that a good stabilization can be realized when the capacitor 138 is located as close as possible to the respective integrated circuit chip.

As can be further seen from FIG. 1, in the embodiment described here there is a further interconnection structure 160 connecting the integrated circuit chips 122, 124 with each other. The further interconnection structure 160 is realized by several via connections, which extend straight through the interconnect carrier 130 and the insulating core 132 of the interconnect carrier 130. This means that the further interconnection structure 160 provides the shortest electric connection between corresponding connections of the two integrated circuit chips 122, 124.

Specifically, the further interconnection structure 160 comprises two further electric conductor paths 171 and 173, which are each realized by a cylindrical metallized via connection. Thereby, the metallization may either completely fill the cylindrical via or may only be provided at the side wall of the respective cylindrical via. The cylindrical via may be formed by a known mechanical drilling procedure. Further, according to the embodiment described here the further interconnection structure 160 comprises a further conductor path 172, which has the shape of a double truncated cone. This metallized via structure 172 within the interconnect carrier 130 can be formed by a known laser drilling procedure, wherein a first truncated cone 172a is formed by a first laser beam impinging onto the first side 130a of the interconnect carrier 130 and a second truncated cone 172b is formed by a second laser beam impinging onto the second side 130b of the interconnect carrier 130.

It is pointed out that also the further interconnection structure 160 can be spatially designed in such a manner that an appropriate impedance match between the two integrated circuit chips 122 and 124 is provided. Such an impedance match can be realized for instance by selecting appropriate diameters of the further electric conductor paths 171, 172, 173. Thereby, an appropriate constant diameter can be selected for the cylindrical metallized via connections 171 and 173. An appropriately varying diameter, which changes along the extension of the further electric conductor path 172 through the interconnect carrier 130, can be also used for an impedance match.

Figures 5A, 5B:
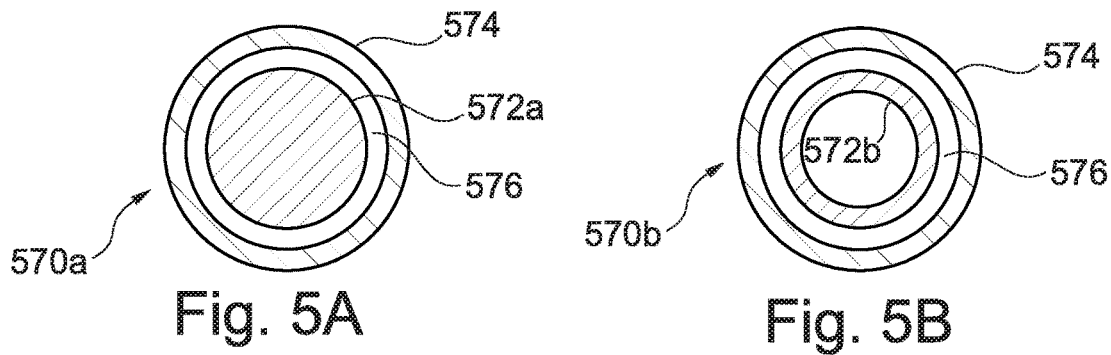
FIGS. 5A and 5B show in a cross-sectional view an electric conductor path which is realized in a coaxial configuration with an inner conductor and an outer conductor being separated from each other by an insulating material.

Further, as can be seen from FIGS. 5A and 5B, the further electric conductor paths 171, 172, 173 can also be realized with two concentric via metallizations, which form a coaxial further electric conductor path 570. Thereby, within a (larger) via there is provided a first metallization representing an outer conductor 574 and a (smaller) via is metallized either fully (see FIG. 5A) or only at its sidewall (see FIG. 5B) such that an inner conductor 572 is formed. In between the outer conductor 574 and the inner conductor 572 there is provided an insulating material 576. A corresponding procedure and its steps for forming such a coaxial electric conductive path 570 has already been elucidated above.

Figure 3:
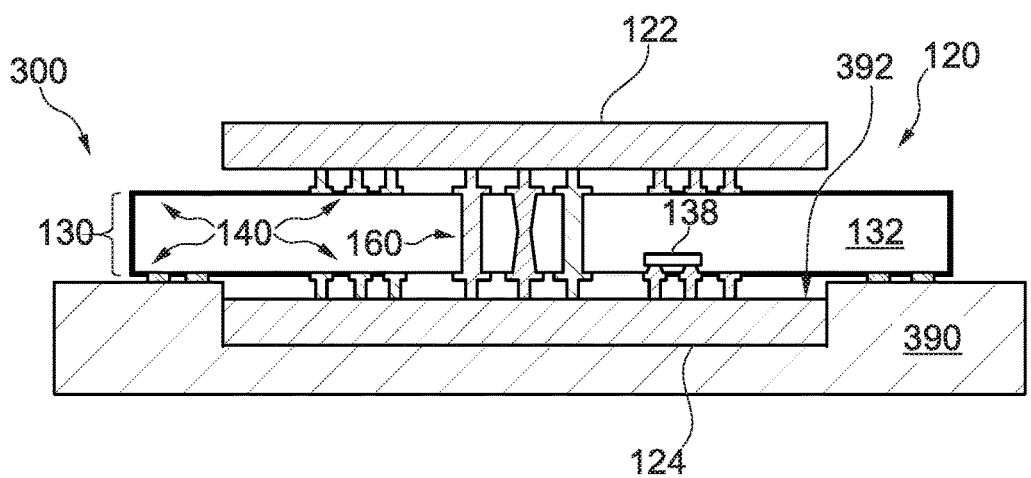
FIG. 3 shows an electronic system comprising a component carrier and the electronic assembly of FIG. 1 mounted at the component carrier.

FIG. 3 shows an electronic system 300 comprising a component carrier 390 and the electronic assembly 120. The component carrier 390 may be for instance a printed circuit board (PCB). However, at least in this context also any other structure, e.g. a substrate, a laminate, etc., represent a component carrier (because also such a structure carries the (second) integrated circuit chip 124).

As can be seen from FIG. 3, the component carrier 390 comprises a cavity 392. The cavity 392 is a so-called open cavity, which can be formed by cutting out material from a pre-product of the component carrier 390. Thereby, the respective cut-out material may be taken from at least one (non-depicted) insulating layer of the pre-product of the component carrier 390 and optionally at least one (non-depicted) metal layer of the pre-product of the component carrier 390. For realizing the cavity 392 the procedure described above can be used, which is called 2.5 D technology.

In the embodiment described here, the electronic assembly 120 is accommodated partially within the cavity 392. Specifically, the size of the cavity 392 is selected such that on the one hand the lower second integrated circuit chip 124 is accommodated in the cavity 392 and edge regions of the interconnect carrier 130 can be placed on the top surface of the component carrier 390, wherein optionally electric contact structures 394 may be provided between the interconnect carrier 130 and the component carrier 390.

Figure 4:
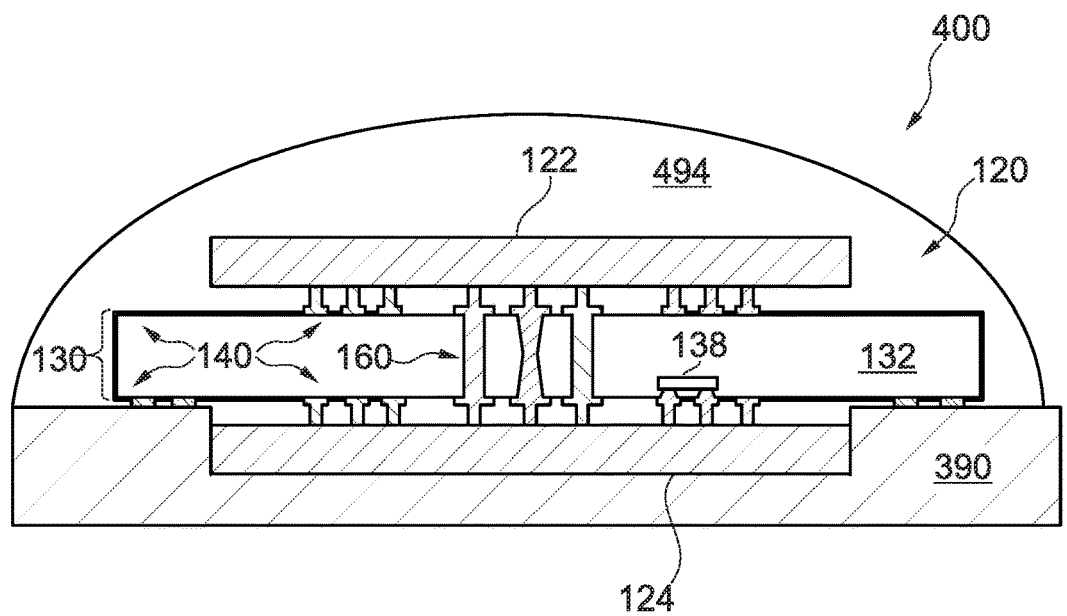
FIG. 4 shows an electronic system comprising a mold structure for protecting the electronic assembly.

FIG. 4 shows an electronic system which differs from the electronic system shown in FIG. 3 only in that there is provided a mold structure 494 around the interconnect carrier 130 and in particular around the upper first integrated circuit chip 122. As has already been described above, the mold structure 494 provides a mechanical protection in particular for the electronic assembly 120.

Figure 6:
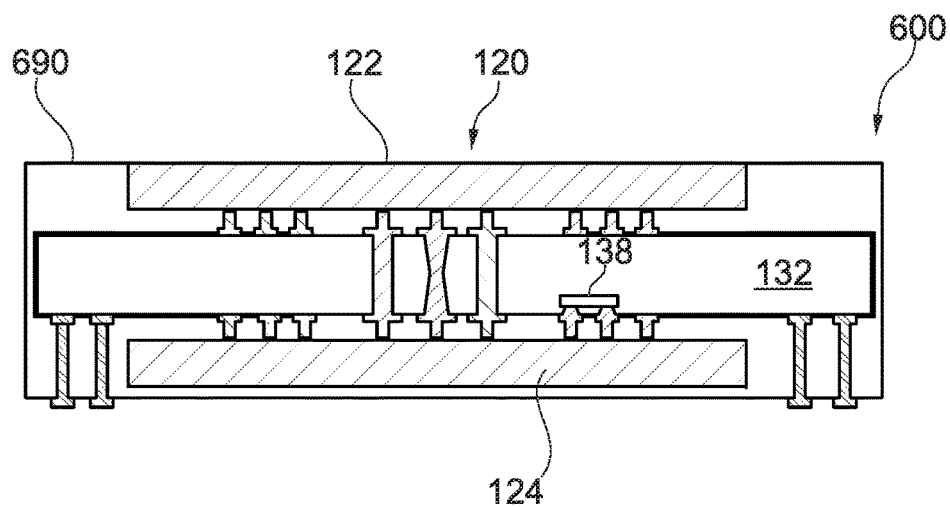
FIG. 6 shows an electronic system comprising an electronic assembly which is completely embedded within a component carrier.

FIG. 6 shows an electronic system 600 comprising the electronic assembly 120 as depicted in FIG. 1. By contrast to the embodiment shown in FIG. 4, the electronic assembly 120 is completely embedded within a component carrier 690. Again, the component carrier 690 may be a PCB or any structure which is capable of accommodating the electronic assembly 120.

The electronic system 600 may be formed by molding the electronic assembly 120 and/or by providing an appropriate laminate structure which comprises different cavities or openings for the various parts of the electronic assembly 120. Thereby, after inserting the electronic assembly 120 into an appropriately shaped opening a remaining open space can be filled in a known manner with an appropriate filling material.

It should be noted that the term "comprising" does not exclude other elements or steps and the use of articles "a" or "an" does not exclude a plurality. Also, elements described in association with different embodiments may be combined.

LIST OF REFERENCE SIGNS 120 electronic assembly
122 first integrated circuit chip
124 second integrated circuit chip
130 interconnect carrier
130a first side of interconnect carrier
130b second side of interconnect carrier
132 insulating core
132a edge of insulating core
134 conducting layer structure
136 contact pad
138 embedded component/capacitor
140 interconnection structure
142 thermal compression bonding element
150 electric conductor path
160 further interconnection structure
171 further electric conductor path/metallized via connection (cylindrical)
172 further electric conductor path/metallized via connection (double truncated cone)
172a first truncated cone
172b second truncated cone
173 further electric conductor path/metallized via connection (cylindrical)
252 first conductor track
254 second conductor track
256 insulating layer
300 electronic system
390 component carrier (with partially embedded electronic assembly)
392 cavity
394 contact structures
400 electronic system
494 mold structure
570a/b coaxial further electric conductor path
572 inner conductor
574 outer conductor
576 insulating material
600 electronic system
690 component carrier/embedding structure (with completely embedded electronic assembly)

The invention claimed is:

1. An electronic assembly, comprising:
an interconnect carrier comprising an electrically insulating core and at least two electrically conducting layers formed at the electrically insulating core;
a first integrated circuit chip mounted at a first side of the interconnect carrier;
a second integrated circuit chip mounted at a second side of the interconnect carrier, wherein the second side is opposite to the first side; and
an interconnection structure electrically connecting the first integrated circuit chip with the second integrated circuit chip;
wherein the electric interconnection structure extends around the insulating core and comprises at least one electric conductor path which is designed in such a manner that an impedance match between the first integrated circuit chip and the second integrated circuit chip is provided.

2. The electronic assembly as set forth in claim 1, wherein the electric conductor path is formed around at least one edge of the insulating core.

3. The electronic assembly as set forth in claim 1, wherein the electric conductor path comprises at least two conductor tracks.

4. The electronic assembly as set forth in claim 3, wherein the at least two conductor tracks are realized by a layered structure wherein an insulating layer is formed between the two conductor tracks.

5. The electronic assembly as set forth in claim 1, further comprising:
a further interconnection structure connecting the first integrated circuit chip with the second integrated circuit chip, wherein the further interconnection structure extends through the insulating core in an overlap region between the first integrated circuit chip and the second integrated circuit chip and comprises at least one further electric conductor path.

6. The electronic assembly as set forth in claim 5, wherein the at least one further electric conductor path is designed in such a manner that a further impedance match between the first integrated circuit chip and the second integrated circuit chip is provided.

7. The electronic assembly as set forth in claim 5, wherein the further interconnection structure comprises at least one metallized via connection.

8. The electronic assembly as set forth in claim 7, wherein the metallized via connection has the shape of a double truncated cone, wherein a tip portion of a first truncated cone being assigned to the first side of the interconnect carrier is connected to a tip portion of a second truncated cone being assigned to the second side of the interconnect carrier.

9. The electronic assembly as set forth in claim 5, wherein the further electric conductor path comprises at least two further conductor tracks realized in a coaxial configuration.

10. The electronic assembly as set forth in claim 1, further comprising:
an electronic component which is embedded within the interconnect carrier and which is electrically connected to at least one of the first integrated circuit chip and the second integrated circuit chip.

11. The electronic assembly as set forth in claim 1, wherein the electronic assembly comprises at least one of the following features:
the insulating core and/or other insulating structures of the interconnect carrier comprise(s) at least one of the group consisting of silicon, glass, ceramic, and an organic dielectric, a resin, a reinforced or non-reinforced resin, an epoxy resin or Bismaleimide-Triazine resin, FR-4, FR-5, cyanate ester, polyphenylene derivate, prepreg material, polyimide, polyamide, liquid crystal polymer, epoxy-based Build-Up Film, polytetrafluoroethylene, and a metal oxide;
the at least two electrically conducting layers and/or other conducting material of the electronic assembly comprises at least one material from the group consisting of copper, aluminum, nickel, silver, gold, palladium, and tungsten, any of the mentioned materials being optionally coated with supra-conductive material such as graphene;
the electronic assembly comprises at least one component embedded in and/or on the surface mounted on the interconnected carrier, wherein the at least one component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;

the interconnect carrier is shaped as a plate; and the interconnect carrier is configured as a printed circuit board or a substrate.

12. An electronic system, comprising:

a component carrier; and an electronic assembly, wherein a first integrated circuit chip and/or a second integrated circuit chip are electrically connected with conductor paths and/or terminal pads of the component carrier, the electronic assembly having an interconnect carrier with an electrically insulating core and at least two electrically conducting layers formed at the electrically insulating core;

wherein the first integrated circuit chip is mounted at a first side of the interconnect carrier;

wherein a second integrated circuit chip is mounted at a second side of the interconnect carrier opposite to the first side;

wherein an interconnection structure electrically connects the first integrated circuit chip with the second integrated circuit chip; and wherein the interconnection structure extends around the insulating core and comprises at least one electric conductor path that provides an impedance match between the first integrated circuit chip and the second integrated circuit chip.

13. The electronic system as set forth in claim 12, wherein the component carrier comprises a cavity, into which the electronic assembly is accommodated partially, wherein one of the first integrated circuit chip and the second integrated circuit chip is accommodated completely within the cavity and the interconnect carrier is mounted to a surface of the component carrier.

14. The electronic system as set forth in claim 12, wherein the component carrier comprises a cavity, into which the electronic assembly is accommodated completely, wherein the surface of at least one of the first integrated circuit chip and the second integrated circuit chip is aligned with a surface of the component carrier.

15. The electronic system as set forth in claim 12, further comprising:

a mold structure which is formed over at least a part of the electronic assembly and over at least a part of the component carrier.

* * * * *